(12) United States Patent
Montrym

(10) Patent No.: US 6,779,170 B1
(45) Date of Patent: Aug. 17, 2004

(54) METHOD AND APPARATUS FOR PERFORMING LOGIC EMULATION

(75) Inventor: John S. Montrym, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 68 days.

(21) Appl. No.: 10/316,678

(22) Filed: Dec. 11, 2002

(51) Int. Cl.[7] .......................... G06F 17/50; G06F 9/455; H03K 19/00
(52) U.S. Cl. .............................. 716/17; 716/16; 703/23
(58) Field of Search .............................. 716/8, 12, 16, 716/17; 703/23, 27; 714/33; 712/28, 236, 14; 326/41; 365/201; 324/765; 257/48

(56) References Cited

U.S. PATENT DOCUMENTS

| | | | | |
|---|---|---|---|---|
| 4,419,747 A | * | 12/1983 | Jordan | 365/201 |
| 5,404,550 A | * | 4/1995 | Horst | 712/14 |
| 5,970,240 A | * | 10/1999 | Chen et al. | 703/25 |
| 6,476,630 B1 | * | 11/2002 | Whitten et al. | 324/765 |
| 2002/0078412 A1 | * | 6/2002 | Wang et al. | 714/732 |

OTHER PUBLICATIONS

Liu et al., "An approach for reducing the programming cost of soft switches in reconfigurable WSI arrays", Ja. 20–22, 1993, Wafer Scale Integration, 1993. Proceedings., Fifth Annual IEEE International Conference on , pp.:233–242.*

GajjalaPurna et al., "Emulatinf large designs on small reconfiguration hardware", Jun. 3–5, 1998, Rapid System Prototyping, Ninth International Workshop, pp.: 58–63.*

Furtek et al., "Labyrinth: a homogeneous computational medium", 1990, IEEE, Custom Integrated circuits Conference, pp.: 31.1.1–31.1.4.*

* cited by examiner

*Primary Examiner*—Leigh M. Garbowski
*Assistant Examiner*—Helen Rossoshek
(74) *Attorney, Agent, or Firm*—Moser Patterson & Sheridan LLP

(57) ABSTRACT

Method and apparatus for providing logic emulation. Specifically, the present invention provides logic emulation by using waferscale integration.

22 Claims, 8 Drawing Sheets

METHOD AND APPARATUS FOR PERFORMING LOGIC EMULATION

The present invention relates to a novel method and apparatus for performing logic emulation. More specifically, the present invention provides logic emulation by using waferscale integration.

BACKGROUND OF THE DISCLOSURE

Logic emulation has become an important aspect of ASIC verification. Logic emulation allows users to create a hardware model of a chip design by using emulation software that maps the design onto reprogrammable circuitry or emulation systems. Specifically, emulation systems often use arrays of discrete programmable logic devices (PLDs), e.g., hundreds of logic processors, such as Field Programmable Gate Arrays (FPGAs), which can mimic the operation of an ASIC design prior to fabrication. This "virtual silicon" is a functional equivalent of the actual chip, operating at close to real time, thereby assuring correct timing relationships.

For example, FIG. 1 illustrates a conventional emulation system having a plurality of printed circuit boards (PCBs) that are in communication with each other with each board containing a plurality of FPGAs. When a chip design or design under test (DUT) is emulated using such a system, the DUT is often expressed as a netlist. The netlist represents the interconnection of circuit elements and the descriptions of the connections among those circuit elements. In other words, the netlist describes a list of elements such as gates, rams, flip-flops, and the wires that go between these elements. In operation, the netlist is mapped onto the FPGAs of the emulation system by using mapping software typically provided by the vendor of the emulation system. The mapping process typically requires a partitioning step where the netlist is partitioned into portions or partitions, where each partition is mapped onto a FPGA. In turn, each FPGA is then complied to map the logical functionality encapsulated by that partition onto the programmable resources of that FPGA. Additionally, the designer would have to ensure that the interconnect resources available on each PCB are compatible with that particular partition.

Thus, logic emulation has transformed electronic design by enabling early integration and hardware-software coverification. Namely, logic emulation allows designers to test their designs before committing to the costly action of fabricating chip prototypes.

However, as chip designs continually increase in complexity, designers are facing various logic emulation pitfalls. First, as chip designs get larger and more complex, the cost and size of the logic emulation system must also increase accordingly. Specifically, referring to FIG. 1, as the size and complexity of the DUT is increased, the emulation system allows for expansion by connecting additional PCBs to the system. Unfortunately, the connections between the PCBs and the connections between the FPGAs are themselves limiting factors, because these interconnections are physically limited. These physical limitations at the boundaries of the FPGAs and at the boundaries of the PCBs create tremendous pressure on the partitioning software to properly identify a partitioning point in the DUT to cut the design so that the limited number of connections available is enough to accommodate a particular partition. In sum, traditional emulation systems have limited routability and mapability due to physical constraints.

Second, conventional emulation systems limited by their interconnect and internal architecture of the PLDs will force a designer to implement "time slice" operations, where multiple cycles of time in the emulation system are required to use the limited interconnections to transfer one equivalent clock worth of data as designed in the DUT. For example, if there are a thousand interconnections between two PCBs and the DUT dictates a transfer of three thousand signals for a given clock cycle, then it is necessary in practice to take three clocks to accomplish the transfer. The use of the time slice approach adds another layer of complexity in the emulation process because the software must now track the completion of multiple transfers before a signal can be declared. Thus, as the complexity of the DUT increases, the size and cost of the emulation system also increase rapidly while performance drops.

Additionally, the level of confidence that the emulation system is performing its functions is also jeopardized. Namely, the emulation software is severely pressured to address complicated demands arising from limited interconnections and the use of multiple time slices to transfer data. Commonly, debugging operations often uncover software bugs directly caused by the FPGA complier or the partitioning software. Namely, the emulation tool itself creates errors that must be addressed by the designer.

Therefore, a need exists for a novel method and apparatus that is capable of providing logic emulation to address increasing complexity of chip designs while providing a lower cost structure, a smaller system size, and natural flexibility in defining and distributing logic and routing functions.

SUMMARY OF THE INVENTION

In one embodiment of the present invention, a novel method and apparatus for providing logic emulation is disclosed. Specifically, the present invention provides logic emulation by using waferscale integration.

The present invention uses a semiconductor wafer to build a sea of soft-programmable logic cells and interconnections. One unique aspect of the present invention is that the cells are homogeneous to such an extent that even flip-flops are constructed from these programmable logic cells. In other words, the fine granularity of the programmable logic cells provides routability and mapability that are not achievable by traditional emulation systems.

The cells implemented on the wafer include, but are not limited to input/output transceiver cells, function or logic cells, routing cells, and clock generating cells. The input/output transceiver cells provide the physical attachments for receiving and sending signals to and from an external device, e.g., a target board.

The function or logic cells are programmable such that the output of the logic cell is an arbitrary function of the inputs. For example, a three-bit input (a, b, c) logic cell will produce an output y(a,b,c). In one embodiment, the three-bit input logic cell will have an eight-bit storage set of values that amount to a truth table.

The routing cells are selectable so that one of its inputs is passed or routed to its output. In one embodiment, the routing cell is implemented as an 8-to-1 routing cell.

Finally, the clock generating cells produce clock signals for other cells on the wafer. In one embodiment, two different clock signals of differing phases are generated from a single waveform, e.g., a square waveform.

In operation, a netlist for a DUT is mapped onto the cells of the wafer, i.e., mapping software is used to map a candidate design onto the programmable resources on the wafer. Since wafers usually have some defective regions, software tools are used to identify those regions so that the design mapping software will avoid mapping portions of the netlist onto the defective regions.

Compared to the traditional PLD systems, the present wafer-scale emulation system has several advantages such as lower cost, smaller size, and higher ratio of interconnect (wiring) to logic elements. Programmable elements can be targeted to the logic emulation function, and as a result non-logic-gate functions like RAMs and clock distribution can be implemented with more efficiency and greater flexibility. The logic and routing functions can be defined in tandem with the software which maps a design to those functions, whereas a conventional system must adapt partitioning and routing software to the limited interconnect and internal architecture of PLDs. Finally, software quality and reliability (e.g., number of bugs) for the present wafer-scale system should be better when compared to a traditional emulation system, because the present software is not pressured to address the constraints of FPGA and PCB boundaries.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
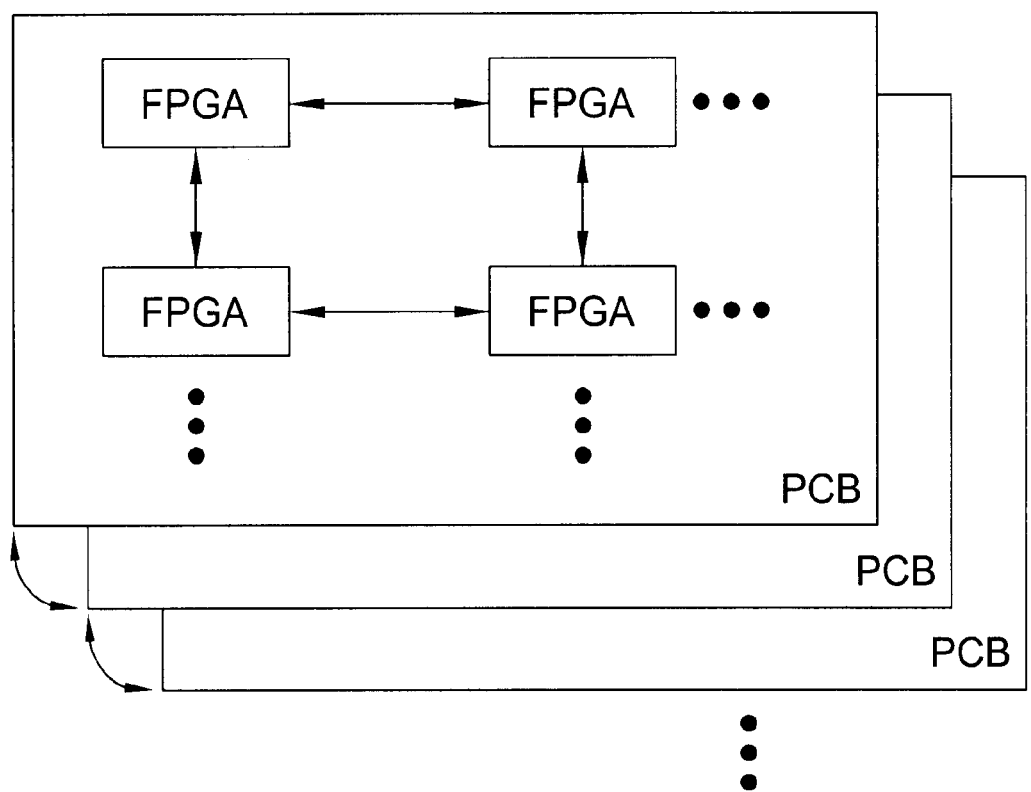
FIG. 1 illustrates a block diagram of a traditional emulation system.
Figure 2:
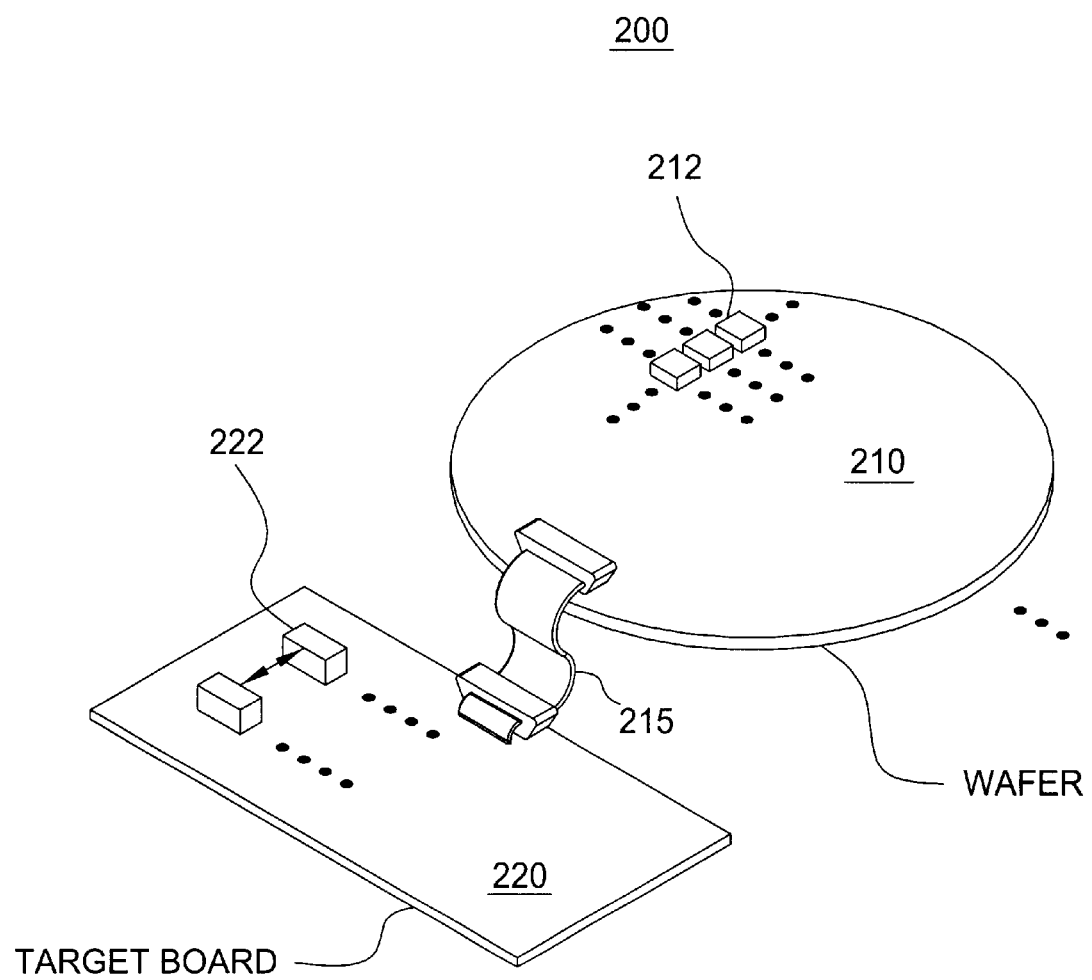
FIG. 2 illustrates a block diagram of a wafer-scale emulation system of the present invention.

FIG. 2 illustrates a block diagram of a wafer-scale emulation system 200 of the present invention. Specifically, the wafer-scale emulation system 200 comprises a semiconductor wafer 210 having a sea of programmable cells 212, and a communication channel 215, e.g., an electrical cable. It should be noted that multiple communication channels 215 can be deployed to provide a more comprehensive and flexible interface between the wafer 210 and the target board 220. The wafer-scale emulation system 200 is implemented to mimic the functions of a DUT, e.g., a chip that is intended to be deployed within a target board 220.

In practice, a netlist for the DUT is generated and mapped onto the sea of programmable cells 212. Once the routed design is implemented on the wafer, the DUT can be tested and debugged in conjunction with the components 222 deployed on the target board 220. This emulation approach allows the DUT to be simulated within its intended operating environment without having to fabricate the chip. Although FIG. 2 only illustrates the wafer 210 and cable 215, it should be noted that the overall emulation system may incorporate other modules or devices (not shown) such as a controller or processor, a power supply, a wafer holder and various input/output devices such as a keyboard, a mouse, a display, a storage device and so on. The functions and structures of the sea of programmable cells 212 will be further described below. It should be noted that the fabrication or etching processes necessary to produce these homogeneous cells on a semiconductor wafer are well known in the art and, thus, will not be described herein.

Figure 3:
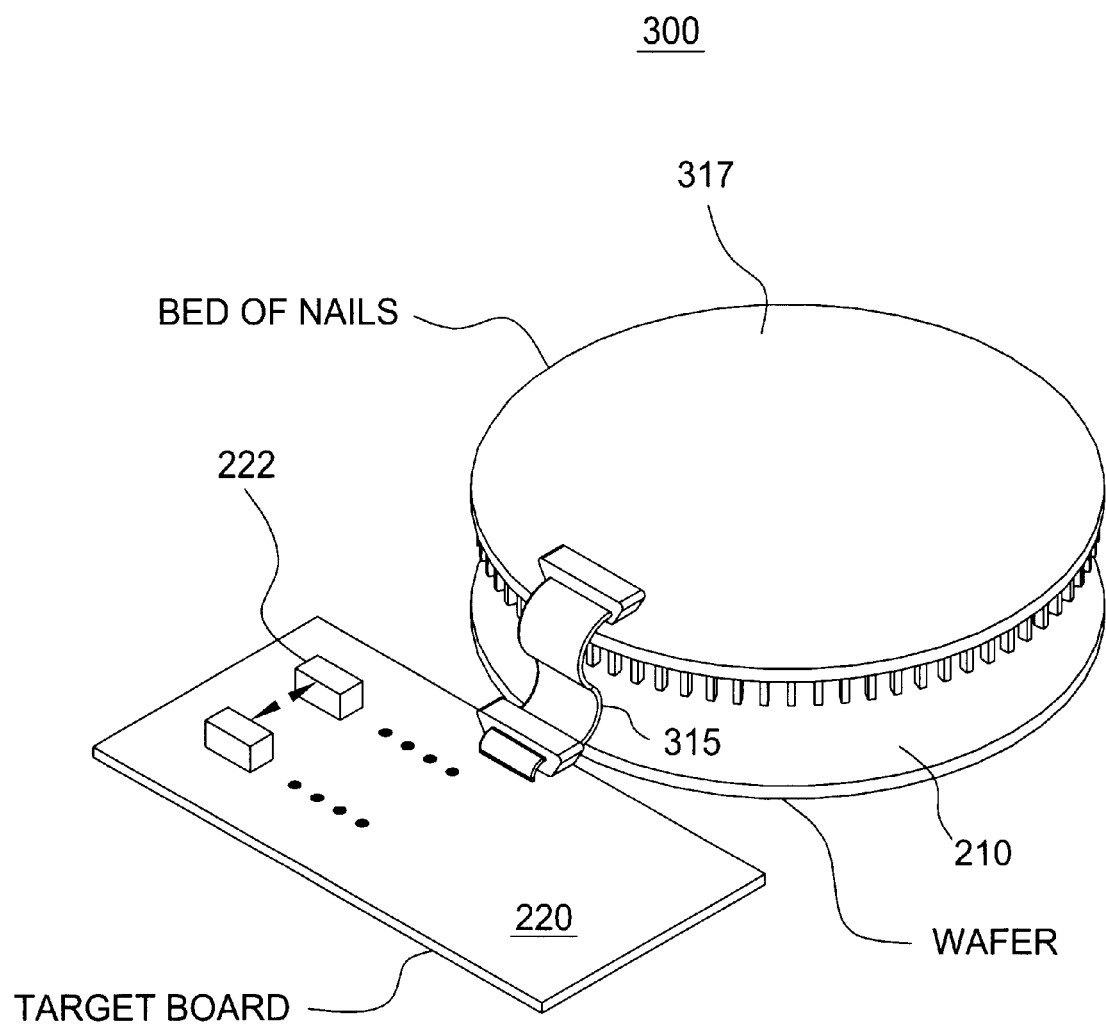
FIG. 3 illustrates an alternate block diagram of a wafer-scale emulation system of the present invention.

FIG. 3 illustrates an alternate block diagram of a wafer-scale emulation system 300 of the present invention. The wafer-scale emulation system 300 is very similar to the wafer-scale emulation system 200 with the exception that the communication channel 315 is now coupled to a bed of nails board or interface 317. This interface allows a more flexible method in providing the necessary interface between the wafer 210 and the target board 220. For example, the I/O transceiver cells can now be deployed arbitrarily on the wafer without being aggregated to a particular area, e.g., grouped together to be coupled to a physical connector. This bed of nail approach furthers the goal of providing an emulation system capable of offering superior routability and mapability over conventional emulation systems.

The wafer 210 can be composed of chip-sized substructures, each substructure comprising logic circuits. In one embodiment, all the chip-sized substructures are identical. Chip-sized substructures are used to allow standard semiconductor manufacturing techniques to be used, including wafer-stepper-based photolithography techniques. With a wafer stepper, the alignment between die locations on the wafer are not as precise as the layers within a die location. But, this is overcome with different design rules for interconnect between die locations; for example, a metal layer for interconnecting two die locations can have 10× line width and 10× spacing design rules as compared to the rules for the same metal layer within a die location.

Figure 4:
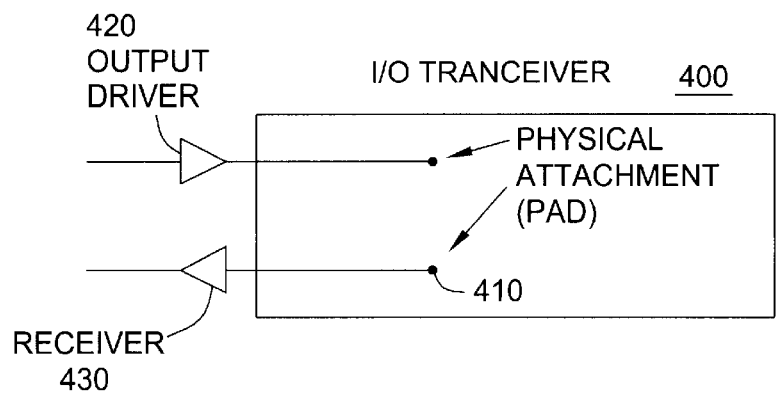
FIG. 4 illustrates a block diagram of an Input/Output transceiver cell of the present invention.

FIG. 4 illustrates a block diagram of an Input/Output (I/O) transceiver cell 400 of the present invention. Specifically, the I/O transceiver cell 400 comprises a physical attachment 410, e.g., a pad, for passage of signals between the wafer and the outside world, e.g., a target board. The I/O transceiver cell 400 also comprises an output driver 420 and a receiver 430. Specifically, the output driver 420 and receiver 430 are driven from inside the sea of logic of the wafer. For a typical implementation (e.g., a 200 mm wafer), there may be between 1000 to 2000 I/O transceiver cells 400. However, those skilled in the art will realize that the present invention is not limited to a particular number of I/O transceiver cells 400 or to a particular wafer size.

Figure 5:
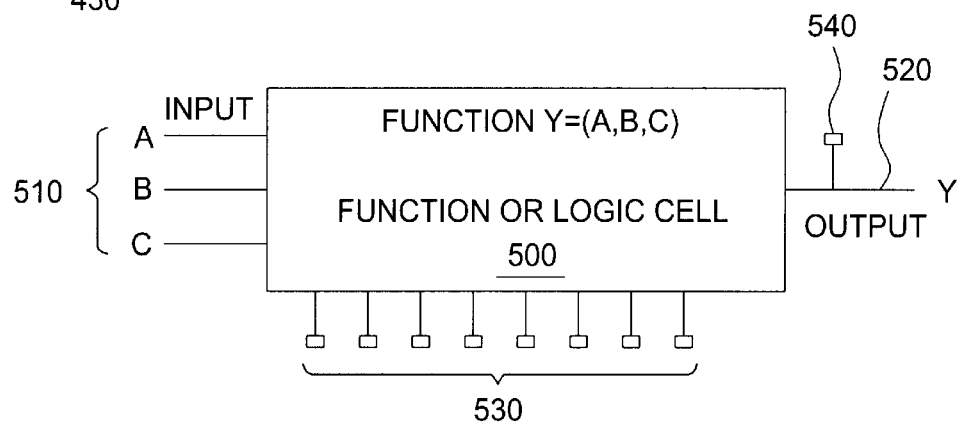
FIG. 5 illustrates a block diagram of a function or logic cell of the present invention.

FIG. 5 illustrates a block diagram of a function or logic cell 500 of the present invention. Specifically, the function or logic cell 500 is programmable such that the output of the logic cell is an arbitrary function of the inputs. In one embodiment, a three-bit input (a, b, c) 510 logic cell will produce an output y(a,b,c) 520. The three-bit input logic cell will have an eight-bit storage set of values 530 that express the logic function's truth table. However, although the present function or logic cell 500 is disclosed as a three-input, one output logic cell, those skilled in the art will realize that the present invention is not so limited. The use of a three-to-one logic cell provides a reasonable balance between the degree of desired functionalities while maintaining fine granularity of the programmable cells. Nevertheless, those skilled in the art will realize that other sizes of logic cells can be adapted to the present invention.

Additionally, the output of the function or logic cell 500 may optionally employ a scanable or observable pad 540. This allows the state of each logic cell 500 to be sampled after each clock pulse, thereby enabling detailed observation of the behavior of the device under test. Alternatively, a scanable circuit can be put in series with an output 520 or 620, operable in modes such as: (i) pass through, used for normal operation; (i) capture, wherein the value of the output 520 or 640 is stored into a shift register that comprises a plurality of scanable circuits; (iii) shifting, where the data in the shift register is shifted along the shift register bits, providing the ability to shift data in from an external source and to shift data out to an external destination; and (iv) driving, wherein the data in the shift register is driven to the input of blocks, effectively replacing the value that would otherwise be received from the outputs 520 or 640. Scan path techniques are known in the art, and generally employ their own clock signal(s) and control signals. The can paths can be used to test the wafer scale emulation circuits to determine where faults are located.

Figure 6:
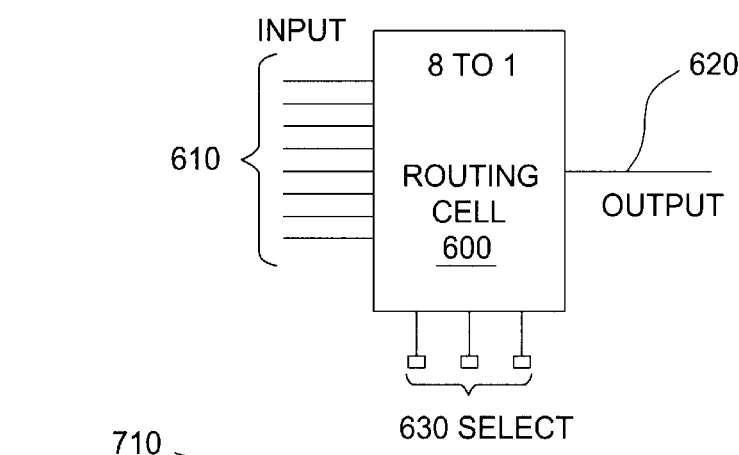
FIG. 6 illustrates a block diagram of a routing cell of the present invention.

FIG. 6 illustrates a block diagram of a routing cell 600 of the present invention. The routing cells are selectable so that one of its inputs 610 is passed or routed to its output 620, via select lines 630. In one embodiment, the routing cell is implemented as an 8-to-1 routing cell. However, although the present routing cell 600 is disclosed as an eight-input, one output routing cell, those skilled in the art will realize that the present invention is not so limited. Namely, other sizes of routing cells can be adapted to the present invention.

Figure 7:
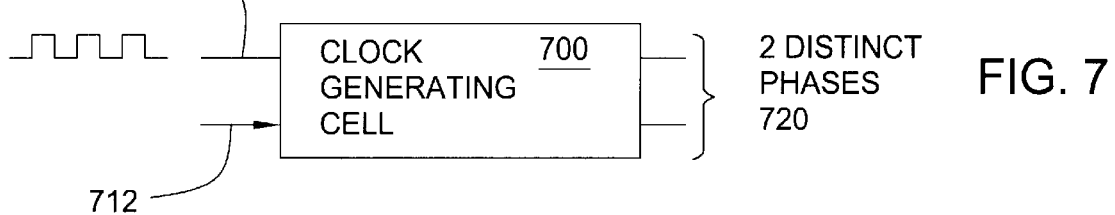
FIG. 7 illustrates a block diagram of a clock generating cell of the present invention.

FIG. 7 illustrates a block diagram of a clock generating cell 700 of the present invention. The clock generating cell is designed to provide clock signals lo for other cells on the wafer. In one embodiment, two different clock signals of differing phases 720 (e.g., an open phase and a close phase) are generated from a single clock-type waveform 710, e.g., a free-running square waveform. The clock generating cell is capable of providing programmable 2-phase non-overlapping high and low periods, e.g., for up to 32 different clocks. Clocks will be able to run asynchronously and can be stopped via the interface, to allow state readout.

In fact, clock generating cell can be implemented to receive a feedback on path 712 to inform the clock generating cell as to the timing to move on to the next phase. However, although the present clock generating cell 700 is disclosed as a two-phase clock generating cell, those skilled in the art will realize that the present invention is not so limited. Namely, other number of phases of clock generating cell can be adapted to the present invention.

Figure 10A:
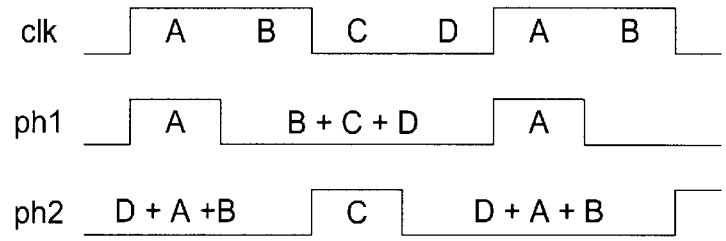
FIG. 10A illustrates a timing diagram for a clock generating cell.
Figure 10B:
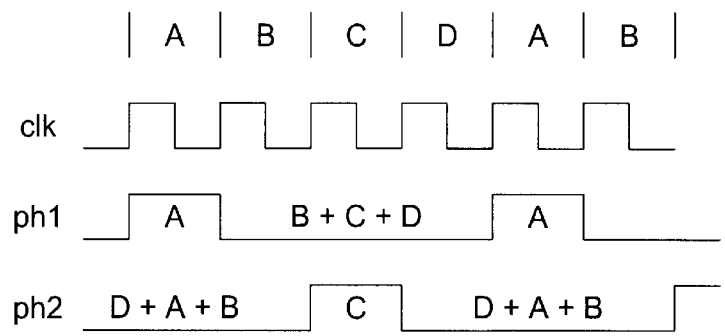
FIG. 10B illustrates an alternate timing diagram for a clock generating cell.
Figure 10C:
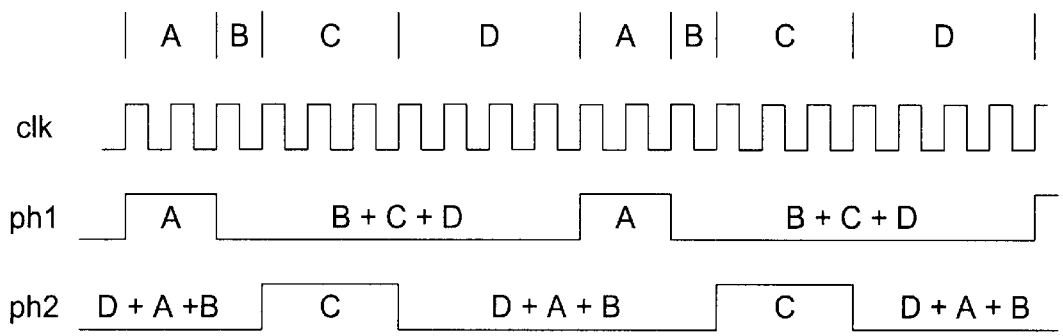
FIG. 10C illustrates a second alternate timing diagram for a clock generating cell.

FIG. 10A illustrates a timing diagram for a clock generating cell producing two-phase non-overlapping clocks, ph1 and ph2. In one embodiment, to avoid having to control clock skew within the netlist, the present invention uses 2-phase non-overlapping clocks. The clock pulse widths can be fixed or programmable, and in FIG. 10A, pulse widths A and C can be set by analog methods, while the period is set by the clk signal. In the example of FIG. 10B, the pulse width are determined digitally from the clk signal. In the example of FIG. 10C, a programmable number of cycles of the clk signal are used to set the pulse widths A and C, and to also set the spacing between the pulses, B and C.

The minimum Width of interval A and C should be long enough to ensure that the slave/master latches will capture their data, even after the pulse has traveled through a bounded number of logic or routing cells. The minimum width of interval B and D should be long enough to ensure that for the worst-case clock skewed pair of cells, there is no situation where the beginning of C arrives before the end of A, nor may the beginning of A arrive before the end of C. Finally, the time from the beginning of A to the end of C should be long enough to allow logic propagation.

Figure 8:
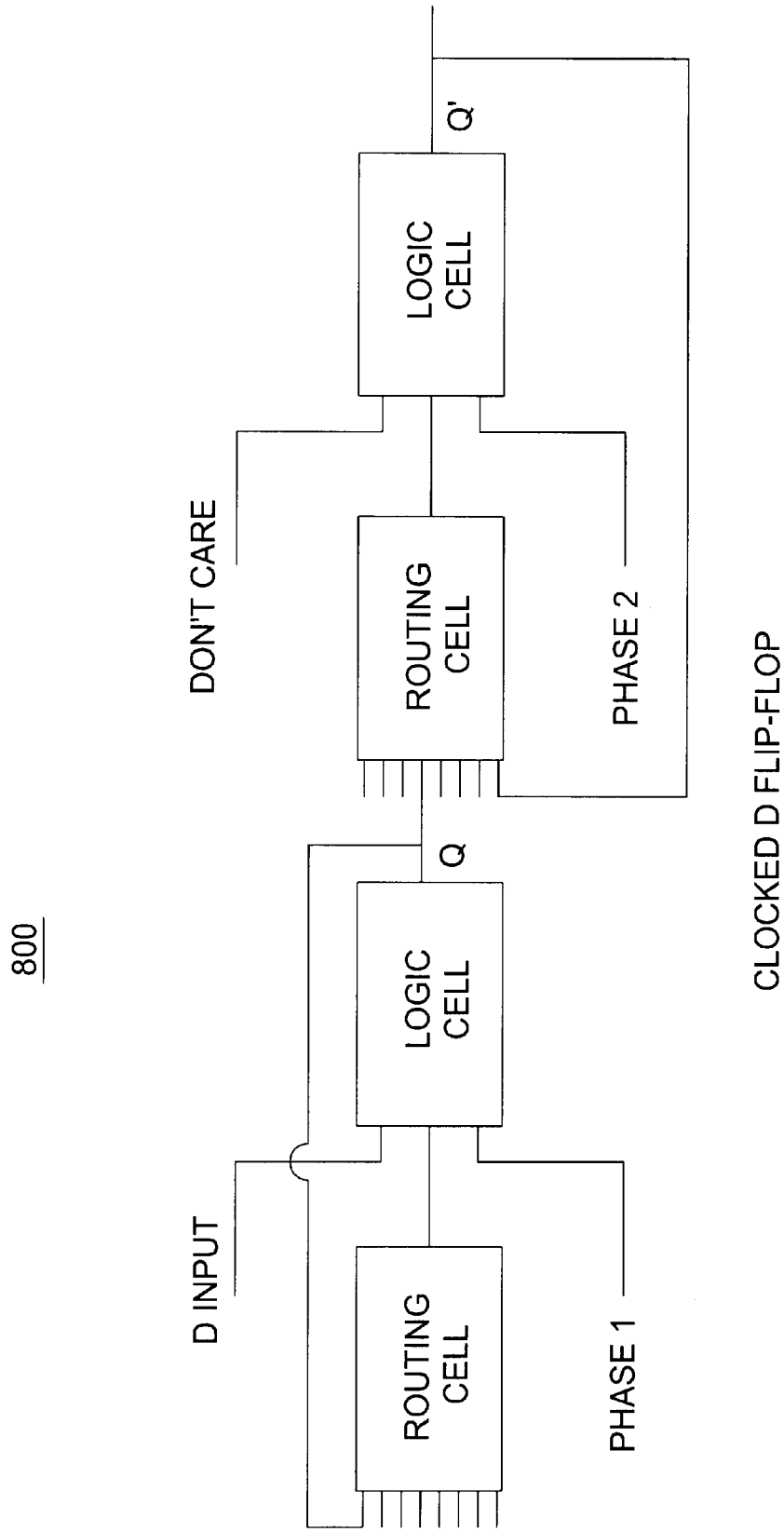
FIG. 8 illustrates a block diagram of a flip-flop formed using the routing and logic cells of the present invention.

FIG. 8 illustrates a block diagram of an edge-triggered flip-flop 800 formed using the routing and logic cells of the present invention. As shown above, once a plurality of homogeneous programmable cells are defined, it is now possible to form more complex devices such as a flip-flop 800 and so on.

Flip-flops can be built as master-slave devices. A flip-flop connected to a pure clock in the design can be built as follows:

original: D, Q, CLK
mapped: master_q=!(master_qn &!(ph2 & d))
    master_qn=!(master_q &!(ph2 &!d))
    slave_q=!(slave_qn &!(ph1 & master_q))
    slave_qn=!(slave_q &!(ph1 & master_qn))
CLK transforms into a signal pair, [ph1,ph2].

One goal is to support gated clock designs. The method is to remap structures as follows. For a clock-type signal gated with a normal signal, there are four cases:

| original | translation |
| --- | --- |
| clk AND signal | [!ph1 AND signal , ph2] |
| !clk OR signal | [ph1 OR signal , ph2] |
| clk OR signal | [ph1 , !ph2 OR signal] |
| !clk AND signal | [ph1 , ph2 AND signal] |

Figure 11:
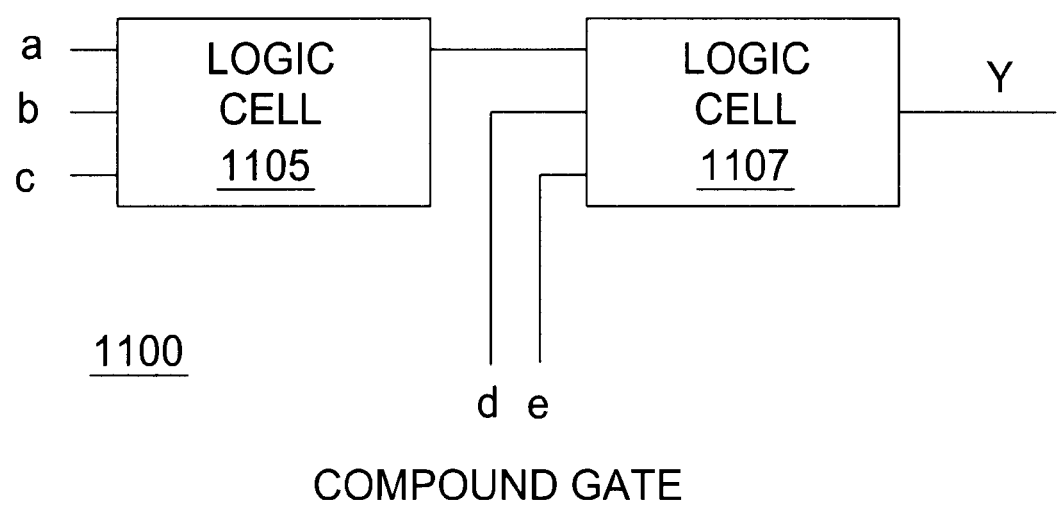
FIG. 11 illustrates a block diagram of a compound gate formed using two logic cells of the present invention.

FIG. 11 illustrates a block diagram of a compound gate 1100 formed using two logic cells of the present invention. Namely, a compound gate, like a 3-input AND with a 2-input AND can be wired to a 2-input NOR to produce an output Y=~((a & b & c)|(d & e)).

Specifically, FIG. 11 illustrates an 3-input AND implemented by a first logic cell 1105 and an 2-input AND implemented by a second logic cell 1107 of the present invention. The output of the first logic cell 1105 is fed as an input along with inputs "d" and "e" to the second logic cell 1107, thereby producing the output Y of a compound gate.

Figure 9:
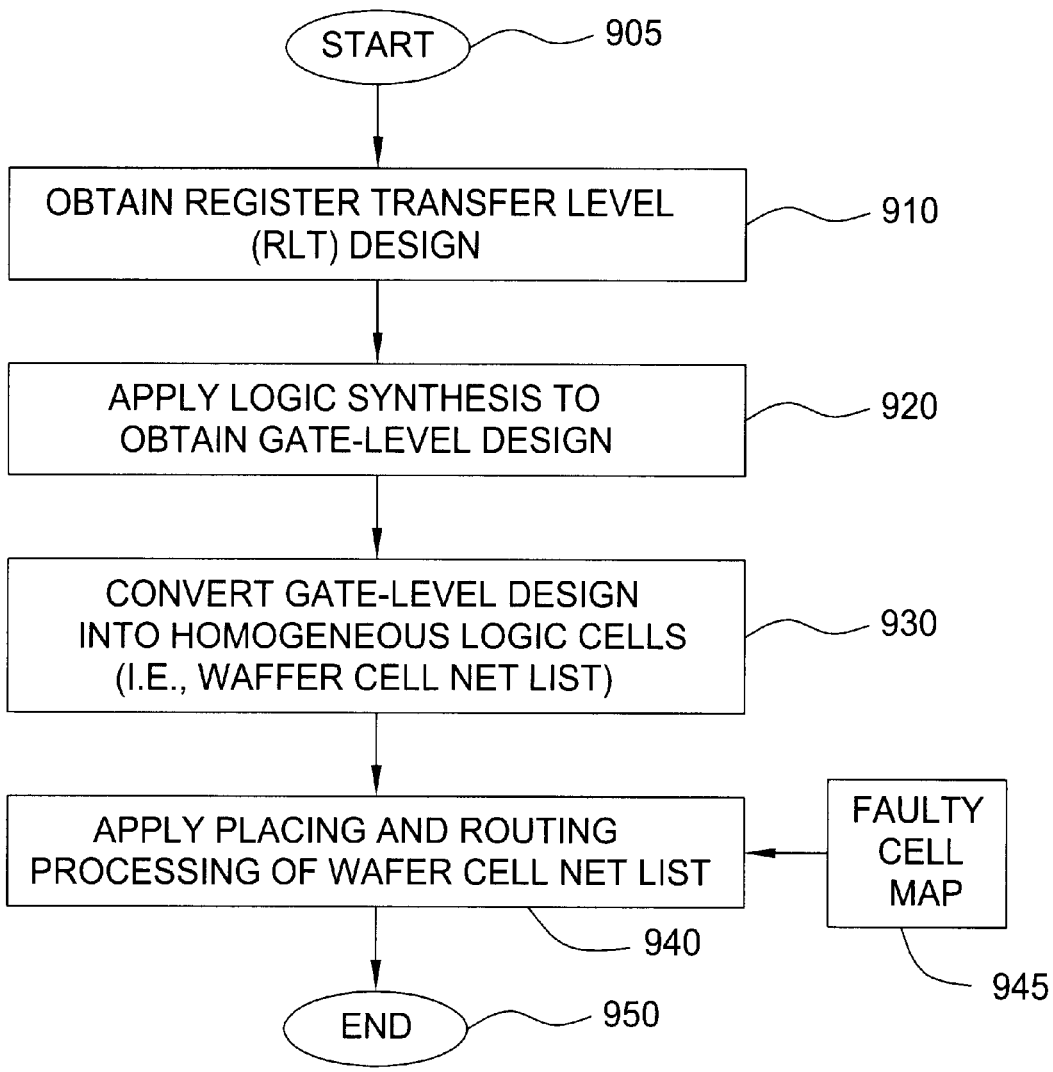
FIG. 9 illustrates a flowchart of a method for mapping a netlist of a DUT onto a wafer-scale emulation system of the present invention.

FIG. 9 illustrates a flowchart of a method 900 for mapping a netlist of a DUT onto a wafer-scale emulation system of the present invention. Method 900 starts in step 905 and proceeds to step 910.

In step 910, a register transfer level (RTL) design is obtained for the DUT. The RTL design concentrates on design at the register and logic level and the blocks which join them. The RTL is a means of exploiting the separation of data and control in order to simplify the design process. Thus, RTL is a hierarchical level of abstraction higher than a gate level design and is well known in the art.

In step 920, logic synthesis is applied to the RTL design to obtain gate-level designs. Logic synthesis processing tools are readily available from commercial or academic sources. The gate-level designs effectively comprise a list of elemental logic cells such as flip-flops, multiplexers and the like.

In step 930, the gate-level designs are converted into the homogeneous logic cells of the present invention, i.e., a wafer cell netlist, which is then fed in step 940 to a placing and routing processing step to produce a routed design on the physical wafer. It should be noted that the placing and routing processing step applies information extracted from a faulty cell map that allows the placing and routing processing step to avoid faulty cells detected on the wafer. Since it is anticipated that the yield on the wafer will be less than 100%, the faulty cell map will guide the software tools to avoid defective programmable cells. Method 900 then ends in step 950.

Thus, the present invention discloses the use of whole-wafer or wafers to build a sea of soft-programmable cells, which is large enough to emulate any chip. A 300 millimeter diameter is approximately 300 times the area of a 15×15 mm chip. Thus, compared to the traditional PLD systems, the present wafer-scale emulation system has several major advantages such as lower cost, smaller size, and higher ratio of interconnect (wiring) to logic elements. Additionally, software quality and reliability (e.g., number of bugs) for the present wafer-scale system should be better when compared to the traditional emulation system, because the present software is not pressured to address the constraints of FPGA and PCB boundaries.

Although various embodiments which incorporate the teachings of the present invention have been shown and described in detail herein, those skilled in the art can readily devise many other varied embodiments that still incorporate these teachings. In the claims, elements of method claims are listed in a particular order, but no order for practicing of the invention is implied, even if elements of the claims are numerically or alphabetically enumerated.

What is claimed is:

1. A logic emulation apparatus comprising:
   a semiconductor wafer having a plurality of programmable cells, wherein a portion of said plurality of programmable cells are input/output transceiver cells, wherein a portion of said plurality of programmable cells are function cells, wherein a portion of said plurality of programmable cells are routing cells and wherein a portion of said plurality of programmable cells are clock generating cells.

2. The logic emulation apparatus of claim 1, wherein at least one of said function cells is a programmable cell having three inputs and one output.

3. The logic emulation apparatus of claim 1, wherein at least two of said programmable cells are cascaded to form a flip-flop.

4. The logic emulation apparatus of claim 2, wherein said output of said function cell has a scanable path.

5. The logic emulation apparatus of claim 1, wherein at least one of said routing cells is a programmable cell having eight inputs and one output.

6. The logic emulation apparatus of claim 5, wherein said output of said routing cell has a scanable path.

7. The logic emulation apparatus of claim 4, wherein at least one of said routing cells is a programmable cell having eight inputs and one output, wherein said output of said routing cell has a scanable path, wherein said scanable paths of said at least one function cell and said at least one routing cell form a scan-chain.

8. The logic emulation apparatus of claim 1, wherein at least one of said clock generating cell produces two clock signals of different phases from a single input signal.

9. The logic emulation apparatus of claim 8, wherein said phase difference of said two clock signals are programmable.

10. The logic emulation apparatus of claim 1, wherein at least two of said programmable cells are cascaded to form a compound gate.

11. A method for implementing wafer scale emulation, said method comprising the steps of:
   a) identifying defects on a wafer; and
   b) mapping a plurality of programmable cells onto non-defective portions of said wafer, wherein:a portion of said plurality of programmable cells are input/output transceiver cells, wherein a portion of said plurality of programmable cells are function cells, wherein a portion of said plurality of programmable cells are routing cells and wherein a portion of said plurality of programmable cells are clock generating cells.

12. The method of claim 11, wherein at least two of said programmable cells are cascaded to form a flip-flop.

13. The method of claim 11, further comprising the step of:
   c) providing a scannable path to an output of at least one of said function cells.

14. The method of claim 11, further comprising the step of:
   c) providing a scannable path to an output of at least one of said routing cells.

15. A logic emulation system comprising:
   a semiconductor wafer having a plurality of programmable cells, wherein a portion of said plurality of programmable cells are input/output transceiver cells, wherein a portion of said plurality of programmable cells are function cells, wherein a portion of said plurality of programmable cells are routing cells and wherein a portion of said plurality of programmable cells are clock generating cells;
   a target board; and
   communicating means disposed between said semiconductor wafer and said target board.

16. The logic emulation system of claim 15, wherein said communicating means is an electrical cable.

17. The logic emulation system of claim 15, wherein said communicating means is a bed of nails board.

18. A logic emulation apparatus comprising:
   a semiconductor wafer having a plurality of identical substructures, wherein each of said identical substructures comprises a plurality of programmable cells, wherein a portion of said plurality of programmable cells are input/output transceiver cells, wherein a portion of said plurality of programmable cells are function cells, wherein a portion of said plurality of programmable cells are routing cells and wherein a portion of said plurality of programmable cells are clock generating cells.

19. The logic emulation apparatus of claim 18, wherein at least two of said programmable cells are cascaded to form a flip-flop.

20. The logic emulation apparatus of claim 18, wherein said output of said function cell has a scanable path.

21. The logic emulation apparatus of claim 18, wherein said output of said routing cell has a scanable path.

22. The logic emulation apparatus of claim 18, wherein said substructures cover substantially all of said wafer.

* * * * *